United States Patent [19]

Lee

[11] Patent Number: 5,861,772

[45] Date of Patent: Jan. 19, 1999

[54] CHARGE PUMP CIRCUIT OF NONVOLATILE SEMICONDUCTOR MEMORY

[75] Inventor: Ki-Jong Lee, Seoul, Rep. of Korea

[73] Assignee: Samsung Electronics Co., Ltd., Suwon-City, Rep. of Korea

[21] Appl. No.: 856,936

[22] Filed: May 15, 1997

[30] Foreign Application Priority Data

May 15, 1996 [KR] Rep. of Korea ...................... 96-16053

[51] Int. Cl.[6] .................................................. H03L 7/089
[52] U.S. Cl. ........................ 327/589; 327/536; 327/537; 307/110; 363/59; 363/60
[58] Field of Search .................... 327/536, 537, 327/589, 99, 298, 390; 363/59, 60; 307/110

[56] References Cited

U.S. PATENT DOCUMENTS

| | | | |
|---|---|---|---|
| 4,403,158 | 9/1983 | Slemmer | 307/297 |
| 4,580,067 | 4/1986 | Proebsting et al. | 307/296 R |
| 4,628,214 | 12/1986 | Leuschner | 307/296 R |
| 4,633,106 | 12/1986 | Backes et al. | 307/578 |
| 4,979,088 | 12/1990 | Misaki et al. | 307/110 |
| 5,202,588 | 4/1993 | Matsuo et al. | 307/296.2 |
| 5,258,663 | 11/1993 | Tamaki | 307/296.5 |
| 5,467,050 | 11/1995 | Clapp, III et al. | 327/530 |
| 5,473,563 | 12/1995 | Suh et al. | 365/185.13 |
| 5,682,348 | 10/1997 | Lin et al. | 365/185.23 |

*Primary Examiner*—Timothy P. Callahan
*Assistant Examiner*—An T. Luu
*Attorney, Agent, or Firm*—Jones & Volentine, L.L.P.

[57] ABSTRACT

A charge pump circuit for generating an output voltage in response to a clock pulse is disclosed. The charge pump circuit has a switching node connected to a gate of a transistor which is connected between a high voltage output from a high voltage generator and the output voltage, a first path for providing a first coupling voltage to the switching node in response to the clock pulse and a second path for providing a second coupling voltage to the switching node in response to an inverse signal of the clock pulse. Each path includes a capacitor, where a capacitor in the first path has a coupling ratio greater than that of a capacitor of the second path.

5 Claims, 6 Drawing Sheets

CHARGE PUMP CIRCUIT OF NONVOLATILE SEMICONDUCTOR MEMORY

FIELD OF THE INVENTION

The invention is in the field of nonvolatile memories and is more specifically related to charge pump circuits of the nonvolatile memories.

BACKGROUND OF THE INVENTION

Nonvolatile memories, such as EEPROMs(electrically erasable and programmable memories), use an internally generated high voltage, and a power supply voltage, by which data bits are programmed into memory cells and erased from the memory cells. With the construction of the memory cell in which a floating gate is interposed and electrically isolated between a control gate and a channel region, charges for a data bit are charged at the floating gate to program the memory cell and discharged from the floating gate to perform an erase operation of the memory cell. To perform these functions, an EEPROM needs a voltage high enough to create an electric field between the floating gate and channel region (or bulk region), causing the charges for a data bit to be put into a tunneling condition therebetween. The high voltage generator in the EEPROM is generally referred to as a charge pump circuit. High voltages are generated from a main charge pump circuit and from a local charge pump circuit (or switch charge pump circuit) which receives an output voltage from the main charge pump circuit. High voltage generated by the local charge pump circuit is applied to word lines coupled to control gates of the memory cells (or cell transistors), as disclosed in U.S. Pat. No. 5,473,563.

The local charge pump circuit shown in FIG. 1 provides, during a program mode, a voltage of about 20 V to control gates of cell transistors coupled to a selected word line while unselected word lines are held at a pass voltage of about 10 V. FIG. 1, illustrates a local charge pump, having a generic configuration for the purpose of creating high voltage, including depletion-type MOS (metal-oxide-semiconductor) capacitor 102 and enhancement-typed NMOS field effect transistors 103, 104, 107 and 108. Clock pulse φP generated from oscillator 101 is applied to one electrode of capacitor 102 and the other electrode of capacitor 102, node 110, is connected to the drain and gate of transistor 103. The gate of transistor 103 is coupled to a high voltage generator 105, e.g., the aforementioned main charge pump generating high voltage VH. At switching node 111 connected to the source of transistor 103, the gate of transistor 104 and the gate of transistor 108 which is connected between high voltage generator 105 and output terminal 109, input voltage Vin is loaded through transistor 107 whose gate is fixed to power supply voltage Vcc.

Clock pulse φP, as shown in FIG. 2, has an amplitude between a ground voltage (0 V) and, the power supply voltage Vcc. In order to provide a stable high voltage to a selected word line, first as a precharging step, input voltage Vin is equivalent to Vcc and is applied to input terminal 106, thereby the precharge voltage at node 111 is Vin−Vtn where Vtn is the threshold voltage of transistor 107. The output voltage Vout becomes Vin−2 V tn where 2 V tn is a sum of threshold voltages of transistors 107 and 108. The voltage at node 110 is also Vin−2 V tn during the precharge period. Thereafter, clock pulse φP goes to Vcc and node 110 is pulled up to Vin−2 V tn+ΔV (ΔV denotes an incremented value of voltage) from the precharge level Vin−2 V tn due to a capacitive coupling by capacitor 102. Switching node 111 retains a voltage of Vin−2 V tn+ΔV−VTN (VTN is threshold voltage of transistor 103), which is higher than the precharge level Vin−Vtn by ΔV−Vtn−VTN. Consequently, while φP is being pulled down to the ground voltage along its falling edge, the voltage level on node 110 is lowered to Vin−2 V tn from Vin−2 V tn+ΔV, by ΔV, by means of a decoupling capacitance through capacitor 102. Since the voltage level at node 110, Vin−2 V tn, is lower than the voltage level at switching node 111 Vin−2 V tn+ΔV−VTN, the current voltage level of node 110 becomes Vin−3 V tn+ΔV−VTN due to decreasing the threshold voltage of transistor 104. The voltage level that switching node 111 is Vin−3 V tn+2ΔV−2 V TN. As a result, the voltage level of node 111 is increased by ΔV−(Vtn+VTN) due to the charge accumulation resulting from every rising edge of clock pulse φP generated from oscillator 101.

In order to secure a stabilized application of high voltage output to selected word lines from the charge pump circuit, the ΔV may not be lower than the sum of threshold voltages of transistors 103 and 104, i.e., Vtn+VTN. However, in a low power memory the voltage ΔV is not high enough to overcome Vtn+VTN. Further, it is impossible to boost the output voltage because a body effect induced by an increasing voltage level on node 111 causes the threshold voltages of transistors 103 and 104 to increase, and because the low power supply voltage limits the available charge accumulation on switching node 111. The body effect, otherwise referred to as substrate bias effect or back-bias effect, appears when the junction of the source of a transistor and a substrate is in a reverse-biased condition caused by increasing the threshold voltage of a transistor such as 103 or 104. A generic formula defining the threshold voltage (vt) involved in the body effect is as follows, $$Vt = Vfb + \phi f + Y(2\phi f + Vsb)$$

where Vfb is flat-band voltage, φf is work function, Y body coefficient and Vsb substrate bias sensitivity.

In the above equation, Vsb is inclined to be sensitive to a substrate voltage while voltage V110 at node 110 and voltage V111 at switching node 111 are increasing by themselves, causing the threshold voltages of transistors 103 and 104 to be increased thereby. Therefore, increasing the threshold voltages of the switching transistors 103 and 104 in a low power supply voltage deteriorates the transconduction characteristic with high pumping voltage. Accordingly, the voltage ΔV is not high enough to overcome the threshold voltages of transistors 103 and 104, i.e., ΔV>Vtn+VTN is not achieved (as aforementioned, Vtn and VTN are threshold voltages of transistors 104 and 103, respectively). For example, assuming that the power supply voltage Vcc is 3 V and the coupling ratio of capacitor 102 is 0.9, ΔV and Vth+VTH become about 2.7 V and 1.8 V, respectively. Therefore, the output voltage Vout does not reach let alone exceed 18 V. Referring to FIG. 2, the output voltage Vout is increased during period T1 through which clock pulse φP retains the level of Vcc. But, if Vout rises over 16 v, the increased V111 causes the body effect to be deeper and thereby the coupling voltage ΔV is rapidly reduced to blunt stepping levels of the output voltage Vout. FIG. 4 shows a variation of the output voltage Vout when the power supply voltage Vcc is sloped down, by 0.2 V, to 2.4 V from 3.0 V, demonstrating that the reduction of the power supply voltage is directly involved in decreasing the output voltage Vout of the charge pump circuit.

SUMMARY OF THE INVENTION

Accordingly, an object of the invention is to provide a charge pump circuit having an improved transconduction characteristic in a nonvolatile memory.

It is another object of the invention to provide a charge pump circuit having an improved transconduction characteristic in a nonvolatile memory.

In order to accomplish those objects, a charge pump circuit in accordance with this invention generates an output voltage in response to a clock pulse. The charge pump circuit has a switching node connected to a gate of a transistor which is connected between a high voltage output from a high voltage generator and the output voltage, a first path for providing a first coupling voltage to the switching node in response to the clock pulse and a second path for providing a second coupling voltage to the switching in response to an inverse signal of the clock pulse. Each path includes a capacitor, where a capacitor in the first path has a coupling ratio greater than that of a capacitor of the second path.

DETAILED DESCRIPTION OF THE PREFERRED EMBODIMENTS

Figure 1:
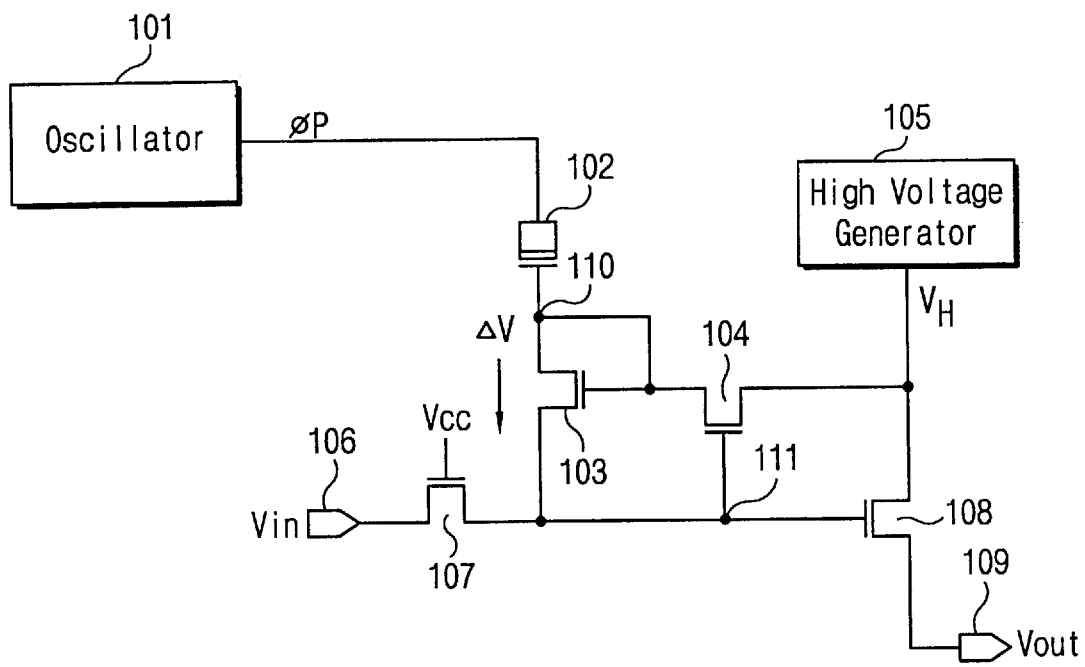
FIG. 1 illustrates a conventional charge pump circuit.
Figure 2:
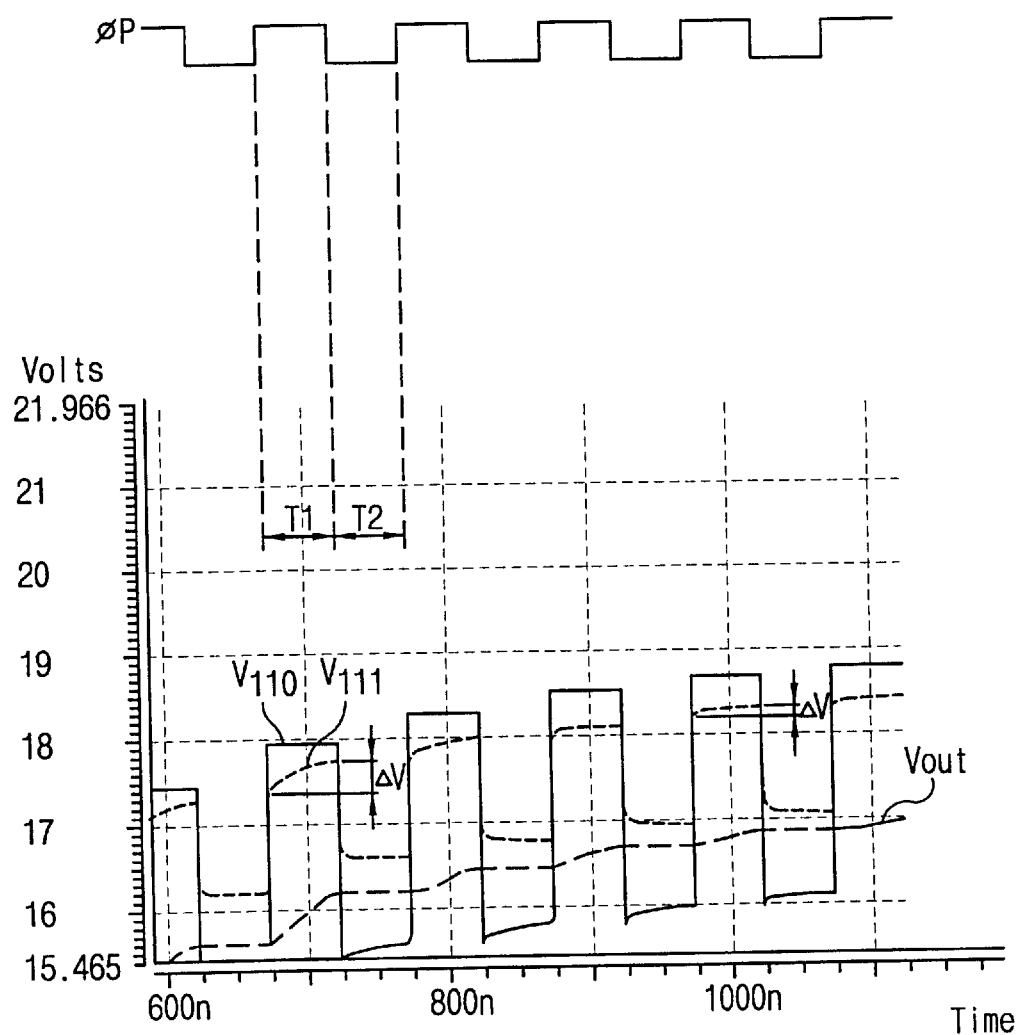
FIG. 2 is a graphic view showing variations of voltages on nodes and output voltages in FIG. 1.

Hereinbelow, applicable embodiments of the invention will be as follows, with the appended drawings. Referring now to the drawings, like reference characters designate like or corresponding parts throughout the several views.

Figure 4:
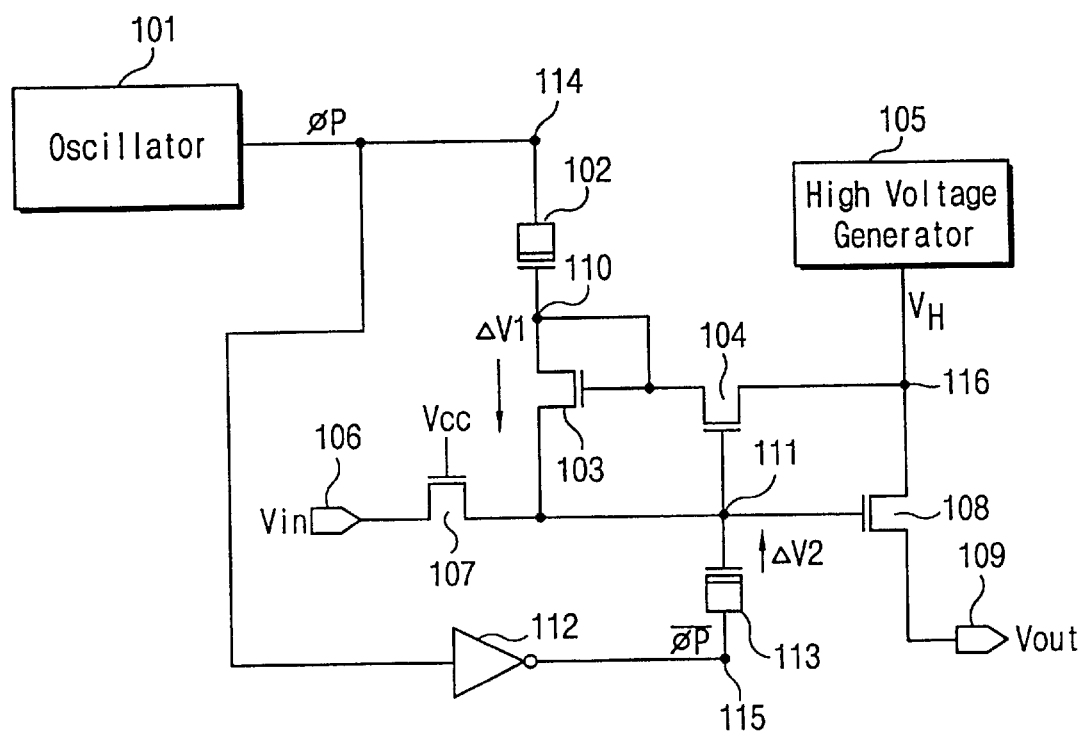
FIG. 4 illustrates a charge pump circuit incorporating the preferred embodiment of the invention.

Referring to FIG. 4, a local charge pump of the invention has a stabilization circuit for a switching voltage therein. The stabilization circuit is constructed between an output terminal of oscillator 101 and a switching node 111, including inverter 112 and capacitor 113 serially connected to each other so as to couple an inverse signal φPB of clock pulse φP to the switching node 111. The stabilization circuit causes the voltage at node 111 to discharge when the voltage of clock pulse φP is equivalent to the power supply voltage Vcc. Further, the stabilization circuit supplies charge to the switching node 111, thereby achieving a constant voltage level at the switching node 111 when the clock pulse φP is at ground voltage (i.e. 0 volts).

The φP as output signal of oscillator 101 is also coupled to node 110 through depletion-typed capacitor 102. Between node 110 and switching node 111 a diode-connected NMOS transistor 103 is connected. The gate and drain of transistor 103, connected to node 110, are coupled to high voltage VH output of high voltage generator 105 through NMOS transistor 104 whose gate is connected to switching node 111. Input voltage Vin is transferred to switching node 111 through normally-turned-on NMOS transistor 107 and output terminal 109 for output voltage Vout is isolated from VH by NMOS transistor 108 with the gate connected to the switching node 111. The high voltage generator 105 may be regarded as a main charge pump circuit in the memory. As shown in FIG. 4, switching node 111 is coupled not only to a path including capacitor 102 but also to another path including capacitor 113. Assuming that the coupling ratio of capacitor 102 is about 0.9, a coupling voltage ΔV at node 110 by means of capacitor 102 becomes (0.9×Vcc). Preferably, the coupling ratio of capacitor 102 is greater than that of capacitor 113.

The clock pulse φP of high voltage level is applied to capacitor 113 through inverter 112, as well as to capacitor 102. Even when φP is at a high voltage level and capacitor 102 is thereby coupled, capacitor 113 receives an inverse signal φPB of φP from inverter 112 which causes the coupling voltage on switching node 111 to discharge independent from the charging action by φP. Thus, the current voltage level of switching node 111 is decreased by φPB and thereby the duration of back-biasing in transistor 103 is shortened. When φP is at a low voltage level, capacitor 102 is in a decoupled state and φPB is at a high voltage, which provides ΔV2. ΔV2 is the coupling voltage supplied by capacitor 113 to switching node 111 and serves to reduce an increase in the threshold voltage of transistor 104 due to back-biasing. Even when ΔV1 is being reduced in a memory system with low power supply voltage such as 2.4 V or 3.3 V, the coupling voltage ΔV2 by capacitor 113 stabilizes a voltage level at switching node 111.

Figure 3:
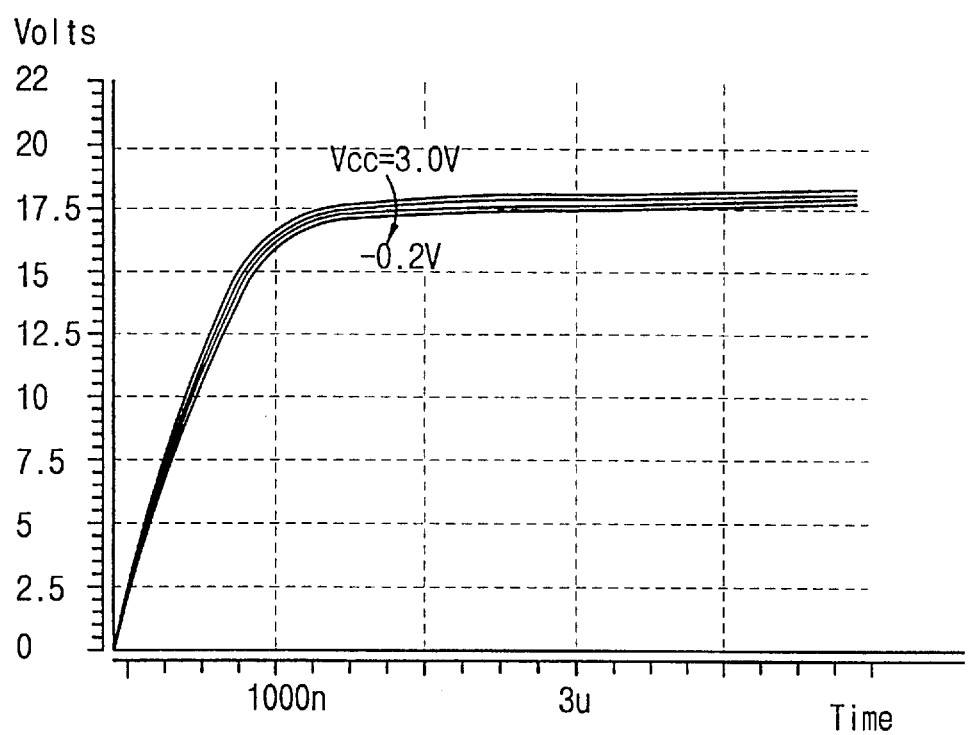
FIG. 3 is a graphic view showing a variation of output voltage in FIG. 1 when a power supply voltage decreases.
Figure 5:
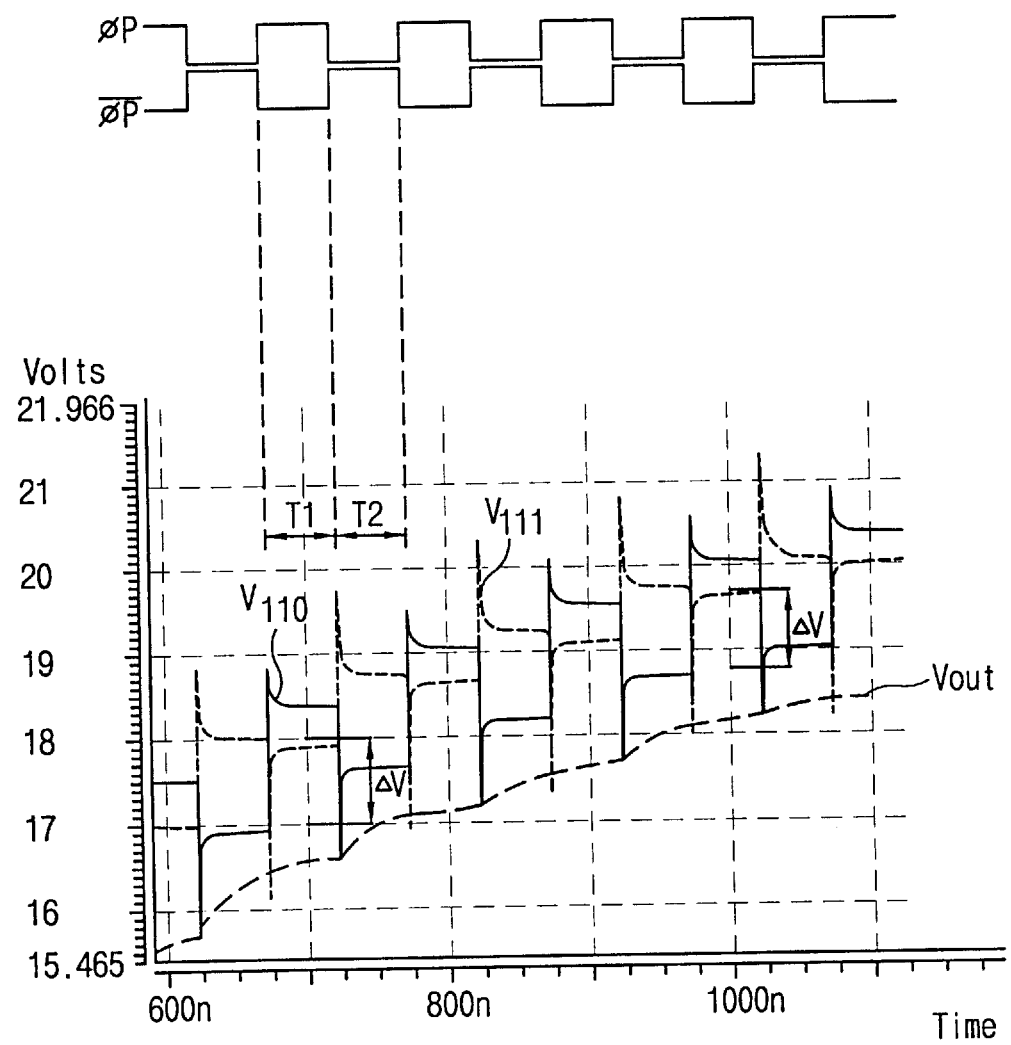
FIG. 5 is a graphic view showing variations of voltages on nodes and an output voltage in FIG. 4.
Figure 6:
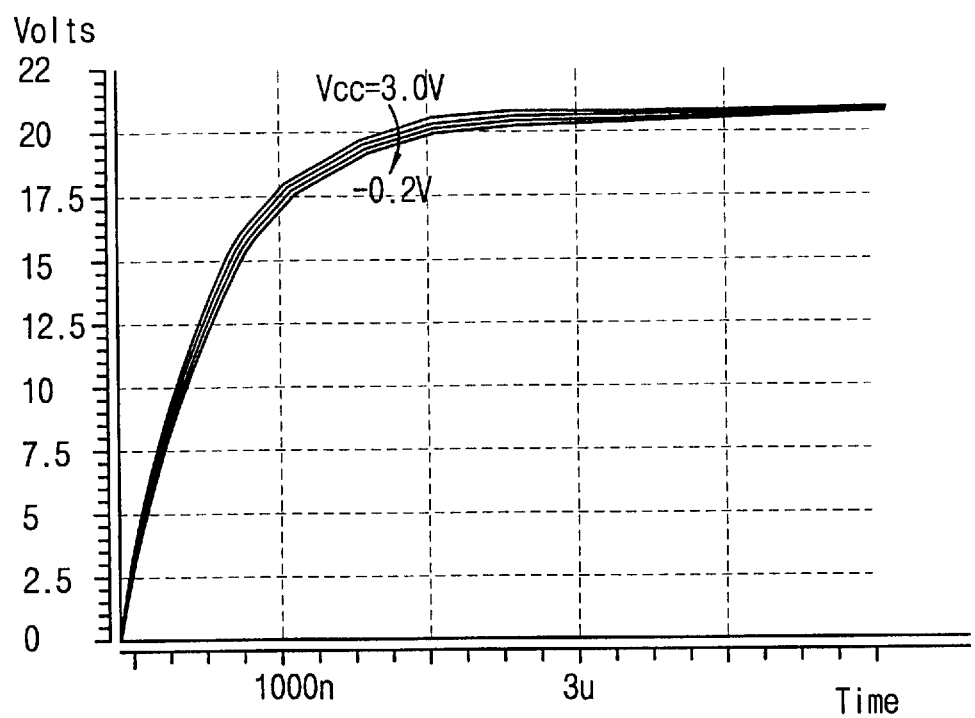
FIG. 6 is a graphic view showing a variation of the output voltage in FIG. 4 when a power supply voltage decreases.

The overall operation of the charge pump circuit of FIG. 4 will be described hereinafter. At an initial state, switching node 111 is at a precharge voltage Vin−Vtn when input voltage Vin is applied to input terminal 106, where Vtn is the threshold voltage of each of transistors 104, 107 and 108. The output voltage Vout is Vin−2 V tn that is the sum of the threshold voltages of transistors 107 and 108. Hence, the voltage level at node 110 is Vin−2 V tn. Thereafter, if φP goes to the level of the power supply voltage from the ground voltage, node 110 is pulled up to Vin−2 V tn+ΔV1, by means of the capacitive coupling with capacitor 102, that is higher than the precharge voltage level by ΔV1. The voltage at switching node 111 is then at a voltage level lower than that of node 110 through the VTN threshold voltage of transistor 103, and further decreases to Vin−2 V tn+ΔV1−VTNΔV2 by ΔV2 because of a decoupling action of capacitor 113. As shown in FIG. 5, output voltage Vout itself increases when φPB is at the voltage level of Vcc, i.e., during the period T2 for incrementing ΔV2, so that the body effect induced in transistor 103 for T1 does not occur and an increased voltage at switching node 111 by ΔV2 causes the transconductive performance of transistor 108 to be advanced. The increase of Vout minimizes the body effect of transistor 103 because ΔV1 is coupled to switching node 111. FIG. 6 shows that the output voltage Vout is not affected from a decrease in power supply voltage Vcc i.e., by 0.2 V, to 2.4 V from 3.0 V . FIG. 6 and FIG. 4 illustrate that about 5 microseconds after the onset of pumping, the output voltage Vout in FIG. 6 is about 21 V whereas that of FIG. 3 stays at about 18 V .

As described above, the charge pump circuit according to the present invention supplies a stabilized output voltage over 20 V to a selected word line for a specific operation such as a programming mode in a nonvolatile memory, and furthermore provides a high voltage even in a low power memory.

Although three embodiments of the invention have been disclosed and described, it will be appreciable that other embodiments and modification of the invention are possible. For example, it is possible to employ enhancement-typed capacitors instead of the depletion-typed capacitors in the circuit, and to utilize other types of field effect transistors instead of the MOS transistors. The invention is not limited to the described embodiments, for the purpose of controlling the coupling voltage ΔV2, other signals modified from the clock pulse may be used.

What is claimed is:

1. A charge pump circuit, comprising:
   a first input terminal for receiving a first voltage;
   a second input terminal for receiving an clock signal;
   a third input terminal for receiving a modified clock signal;
   a fourth input terminal for receiving a second voltage greater than a power supply voltage;
   an output terminal for outputting the second voltage;
   a switching node;
   an intermediate node;
   a first capacitor connected between the second input terminal and the intermediate node;
   a second capacitor connected between the switching node and the third input terminal;
   a first NMOS transistor connected between the first input terminal and the switching node, the first NMOS transistor having a first gate for receiving the power supply voltage;
   a second NMOS transistor connected between the intermediate node and the switching node, the second NMOS transistor having a second gate connected to the intermediate node;
   a third NMOS transistor connected between the fourth input terminal and the intermediate node, the third NMOS transistor having a third gate connected to the switching node; and
   a fourth NMOS transistor connected between the fourth input terminal and the output terminal, having a fourth gate connected to the switching node.

2. A circuit according to claim 1, wherein said first capacitor has a coupling ratio greater than that of said second capacitor.

3. A circuit according to claim 1, wherein said modified clock signal is an inverse signal of said clock pulse.

4. A circuit according to claim 3, further comprising an inverter connected between the second capacitor and the source of the clock pulse.

5. A charge pump circuit, comprising:
   a first capacitor connected between an intermediate node and a source of a clock pulse, the first capacitor responding to the clock pulse;
   a first transistor having a first gate, the first transistor being connected between the intermediate node and a switching node, and the first gate being connected to the intermediate node;
   a second transistor having a second gate, the second transistor being connected between the intermediate node and an output terminal of a high voltage generator, and the second gate being connected to the switching node;
   a third transistor having a third gate, the third transistor being connected between the output terminal of the high voltage generator and an output terminal of the charge pump, and the third gate being connected to the switching node; and
   a second capacitor connected between the switching node and the source of the clock pulse, responding to a modified signal of the clock pulse.

* * * * *